(12) United States Patent
Liu et al.

(10) Patent No.: US 12,086,369 B2
(45) Date of Patent: Sep. 10, 2024

(54) TOUCH DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Yitong Liu, Hubei (CN); Zhuo Zhang, Hubei (CN); Zengjian Jin, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/759,472

(22) PCT Filed: Jul. 1, 2022

(86) PCT No.: PCT/CN2022/103368
§ 371 (c)(1),
(2) Date: Jul. 26, 2022

(87) PCT Pub. No.: WO2023/240710
PCT Pub. Date: Dec. 21, 2023

(65) Prior Publication Data
US 2024/0184410 A1    Jun. 6, 2024

(30) Foreign Application Priority Data
Jun. 15, 2022    (CN) .......................... 202210680481.X

(51) Int. Cl.
*H01L 27/32*    (2006.01)
*G06F 3/041*    (2006.01)
(Continued)

(52) U.S. Cl.
CPC .......... *G06F 3/0446* (2019.05); *G06F 3/0412* (2013.01); *H10K 59/352* (2023.02); *H10K 59/353* (2023.02); *H10K 59/40* (2023.02)

(58) Field of Classification Search
CPC .... H10K 59/353; H10K 59/40; H10K 59/352; G06F 3/0412
See application file for complete search history.

(56) References Cited

U.S. PATENT DOCUMENTS

2021/0405490 A1    12/2021    Guo
2022/0069027 A1*    3/2022    Wang .................. H10K 50/822

FOREIGN PATENT DOCUMENTS

| CN | 106681064 A | 5/2017 |
| CN | 109343263 A | 2/2019 |

(Continued)

OTHER PUBLICATIONS

International Search Report in International application No. PCT/CN2022/103368, mailed on Dec. 19, 2022.
(Continued)

*Primary Examiner* — Deeprose Subedi

(57) ABSTRACT

The present application provides a touch display panel. A shortest distance on a display plane from any point on outer contours of any two of sub-pixel units to a corresponding grid unit of a mesh electrode is very close or even equal. Therefore, brightness displayed by sub-pixels is more uniform at side viewing angles. Especially, brightness displayed by the sub-pixels of different colors at the side viewing angles is more uniform. Accordingly, the present application can solve a problem that the display panel has a large color shift at the side viewing angles.

20 Claims, 6 Drawing Sheets

(51) Int. Cl.
*G06F 3/044* (2006.01)
*G09G 3/20* (2006.01)
*G09G 3/3225* (2016.01)
*H01L 51/52* (2006.01)
*H10K 59/35* (2023.01)
*H10K 59/40* (2023.01)

(56) References Cited

FOREIGN PATENT DOCUMENTS

| | | |
|---|---|---|
| CN | 110660836 A | 1/2020 |
| CN | 112987415 A | 6/2021 |
| CN | 113568526 A | 10/2021 |
| CN | 113594386 A | 11/2021 |
| WO | 2022111171 A1 | 6/2022 |

OTHER PUBLICATIONS

Written Opinion of the International Search Authority in International application No. PCT/CN2022/103368, mailed on Dec. 19, 2022.

* cited by examiner

TOUCH DISPLAY PANEL

FIELD OF DISCLOSURE

The present application relates to a field of display technology and in particular, to a touch display panel.

DESCRIPTION OF RELATED ART

The touch technology of the display panel has gradually developed from the add-on touch panel (TP) technology to the direct on cell touch (DOT: thin film encapsulation touch) technology having touch sensors in a liquid crystal panel. Compared with the add-on touch panel, DOT is directly integrated in the display panel, and no separate flexible circuit board is needed, so the costs are lower, and it is more conducive to the flexible bending of the display panel.

Conventional DOT technology is a metal mesh structure having metal grid lines. That is to say, the capture and identification of touch signals are realized through the mutual capacitive sensing of the metal mesh lines obtained after exposure and etching. In order to avoid affecting the light output of the sub-pixels, the sub-pixels are arranged in metal grid units. At present, a mutual-capacitance-type display panel includes a plurality of pixel units. Each pixel unit includes a plurality of sub-pixels, and the sub-pixels include a red sub-pixel, a green sub-pixel, and a blue sub-pixel. However, in conventional mutual-capacitance-type display panels, brightness displayed by different sub-pixels is not uniform at side viewing angles (viewed from the sides). Especially, the brightness displayed by the sub-pixels of different colors is not uniform when viewed at the side viewing angles, which leads to a great color shift at the side viewing angles.

SUMMARY

The present application provides a touch display panel to solve a problem that the display panel has a large color shift at side viewing angles.

The present application provides a touch display panel, comprising:
- a display light-emitting layer, wherein the display light-emitting layer includes a plurality of sub-pixel units arranged at intervals, and each of the sub-pixel units includes at least one sub-pixel; and
- a mesh electrode, wherein the mesh electrode is arranged on a light-emitting side of the display light-emitting layer, and grid units of the mesh electrode surround the sub-pixel units;
- wherein on a display plane, a difference between any two of shortest distances from different points on an outer contour of each sub-pixel unit and the corresponding grid unit of the mesh electrode is greater than or equal to 0 micrometer and less than or equal to 1 micrometer; and on the display plane, a difference between any two of shortest distances from points on the outer contours of different sub-pixel units to the respectively corresponding grid units of the mesh electrode is greater than or equal to 0 micrometer and less than or equal to 1 micrometer.

Optionally, in some embodiments of the present application, a plurality of through holes are defined in the grid lines of the mesh electrode.

Optionally, in some embodiments of the present application, when a ratio of a shortest distance between two adjacent sub-pixel units to a line width of the grid line of the mesh electrode between the two adjacent sub-pixel units is less than 10/3, at least one through hole is defined in the grid line of the mesh electrode between the two adjacent sub-pixel units.

Optionally, in some embodiments of the present application, the sub-pixel units comprise a plurality of first sub-pixel units, a plurality of second sub-pixel units, and a plurality of third sub-pixel units; and lines connecting centers of two second sub-pixel units and two third sub-pixel units located around one first sub-pixel unit form a virtual isosceles trapezoid, and wherein the center of the first sub-pixel unit is located at an intersection of a perpendicular bisector of the line connecting the centers of the two surrounding second sub-pixel units and a perpendicular bisector of the line connecting the centers of the two surrounding third sub-pixel units; and the centers of the second sub-pixel units and the centers of the third sub-pixel units located around the first sub-pixel unit respectively coincide with vertices of the virtual isosceles trapezoid; and when the line connecting the centers of one second sub-pixel unit and one third sub-pixel unit adjacent to each other is a long base of the virtual isosceles trapezoid, at least one through hole is defined in the grid line of the mesh electrode, which is located between the second sub-pixel unit and the third sub-pixel unit adjacent to each other.

Optionally, in some embodiments of the present application, when the line connecting the centers of one second sub-pixel unit and one third sub-pixel unit adjacent to each other is located at a waist of the virtual isosceles trapezoid, at least one through hole is defined in the grid line of the mesh electrode, which is located between the second sub-pixel unit and the third sub-pixel unit adjacent to each other.

Optionally, in some embodiments of the present application, each of the sub-pixel units comprises at least two sub-pixels, and wherein an outer contour of each of the at least two sub-pixels scales up to extend outward to form a virtual contour, the virtual contours of any two of the at least two sub-pixels intersect with each other, and the outer contour of the sub-pixel unit is an outer contour formed by the union of the virtual contours of the at least two sub-pixels.

Optionally, in some embodiments of the present application, an inner contour of a cross-section of each grid unit of the mesh electrode on the display plane has a same shape as a shape of a cross-section of the sub-pixel located in the grid unit of the mesh electrode on the display plane.

Optionally, in some embodiments of the present application, each of the sub-pixel units comprises any one of a first sub-pixel, a second sub-pixel, and a third sub-pixel, and wherein cross-sections of the first sub-pixel, the second sub-pixel, and the third sub-pixel have a same shape on the display plane.

Optionally, in some embodiments of the present application, the cross-sections of the first sub-pixel, the second sub-pixel, and the third sub-pixel on the display plane are square-shaped, circular-shaped, or elliptical-shaped.

Optionally, in some embodiments of the present application, each of the sub-pixel units comprises any one of a first sub-pixel, a second sub-pixel, and a third sub-pixel: a shape of a cross-section of each first sub-pixel on the display plane comprises an outward convex arc: a shape of a cross-section of each second sub-pixel or each third sub-pixel on the display plane is a polygon comprising an inward concave arc and a straight line: the shape of the cross-section of each third sub-pixel or each second sub-pixel on the display plane is a polygon comprising the inward concave arc and an outward convex arc: the inward concave arc of each second sub-pixel or each third sub-pixel is arranged corresponding to the outward convex arc of one first sub-pixel; and in a pair of one inward concave arc and one outward convex arc arranged corresponding to each other, a concaving direction of the inward concave arc is the same as an outward protruding direction of the outward convex arc.

Optionally, in some embodiments of the present application, each of the sub-pixel units comprises any one of a first sub-pixel, a second sub-pixel, and a third sub-pixel: a shape of a cross-section of each first sub-pixel on the display plane comprises an outward convex arc: a shape of a cross-section of each second sub-pixel and a shape of a cross-section of each third sub-pixel on the display plane are both a polygon comprising an inward concave arc and a straight line: the inward concave arcs of one second sub-pixel and one third sub-pixel are each arranged corresponding to the outward convex arc of one first sub-pixel; and in a pair of one inward concave arc and one outward convex arc arranged corresponding to each other, a concaving direction of the inward concave arc is the same as an outward protruding direction of the outward convex arc.

Optionally, in some embodiments of the present application, each of the sub-pixel units comprises any one of a first sub-pixel, a second sub-pixel, and a third sub-pixel: a shape of a cross-section of each first sub-pixel on the display plane comprises an outward convex arc: a shape of a cross-section of each second sub-pixel and a shape of a cross-section of each third sub-pixel on the display plane are both a polygon comprising an inward concave arc and an outward convex arc: the inward concave arcs of one second sub-pixel and one third sub-pixel are each arranged corresponding to the outward convex arc of one first sub-pixel; and in a pair of one inward concave arc and one outward convex arc arranged corresponding to each other, a concaving direction of the inward concave arc is the same as an outward protruding direction of the outward convex arc.

Optionally, in some embodiments of the present application, the cross-section of each first sub-pixel on the display plane is circular-shaped or elliptical-shaped.

Optionally, in some embodiments of the present application, the shape of the cross-section of each second sub-pixel on the display plane is an octagon including four inward concave arcs and four straight lines.

Optionally, in some embodiments of the present application, the shape of the cross-section of the third sub-pixel on the display plane is an octagon including four inward concave arcs and four outward convex arcs.

Optionally, in some embodiments of the present application, in the grid units of the mesh electrode, the through holes are defined in the grid lines corresponding to the straight lines of the second sub-pixels or the third sub-pixels; and in the grid units of the mesh electrode, the through holes are defined in the grid lines corresponding to the outward convex arcs of the third sub-pixels or the second sub-pixels.

Optionally, in some embodiments of the present application, in the grid units of the mesh electrode, the through holes are defined in the grid lines corresponding to the straight lines of the second sub-pixels and the third sub-pixels.

Optionally, in some embodiments of the present application, in the grid units of the mesh electrode, the through holes are defined in the grid lines corresponding to the outward convex arcs of the second sub-pixels and the third sub-pixels.

Optionally, in some embodiments of the present application, each of the sub-pixel units comprises any one of a first sub-pixel, a second sub-pixel, and a third sub-pixel, and wherein the first sub-pixel, the second sub-pixel, and the third sub-pixel are respectively one of a red sub-pixel, a green sub-pixel, and a blue sub-pixel.

Optionally, in some embodiments of the present application, the first sub-pixel, the second sub-pixel, and the third sub-pixel have different colors from each other.

The present application further provides a touch display device, comprising the touch display panel mentioned above.

ADVANTAGES OF THE PRESENT APPLICATION

The present application provides a touch display panel, comprising:

a display light-emitting layer, wherein the display light-emitting layer includes a plurality of sub-pixel units arranged at intervals, and each of the sub-pixel units includes at least one sub-pixel: and a mesh electrode, wherein the mesh electrode is arranged on a light-emitting side of the display light-emitting layer, and grid units of the mesh electrode surround the sub-pixel units; wherein a difference between any two of shortest distances on a display plane from different points on an outer contour of each sub-pixel unit and the corresponding grid unit of the mesh electrode is greater than or equal to 0 micrometer and less than or equal to 1 micrometer; and a difference between any two of shortest distances on the display plane from points on the outer contours of different sub-pixel units to the respectively corresponding grid units of the mesh electrode is greater than or equal to 0 micrometer and less than or equal to 1 micrometer. The present application is configured such that on the display plane, the difference between any two of the shortest distances from different points of the outer contour of each sub-pixel unit to the corresponding grid unit of the mesh electrode is greater than or equal to 0 micrometer and less than or equal to 1 micrometer. Furthermore, on the display plane, the difference between any two of the shortest distances from points on the outer contours of different sub-pixel units and the grid units of the mesh electrode is greater than or equal to 0 micrometer and less than or equal to 1 micrometer. That is to say, on the display plane, the shortest distances from any points on the outer contours of any two of the sub-pixel units to the respectively corresponding grid units of the mesh electrode are very close or even equal to each other, so that brightness displayed by each sub-pixel unit in a side viewing direction is relatively uniform, especially the brightness displayed by the sub-pixels of different colors in the side viewing direction is relatively uniform, thereby solving a problem of large color shift of the display panel in the side viewing direction.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

Figure 1:
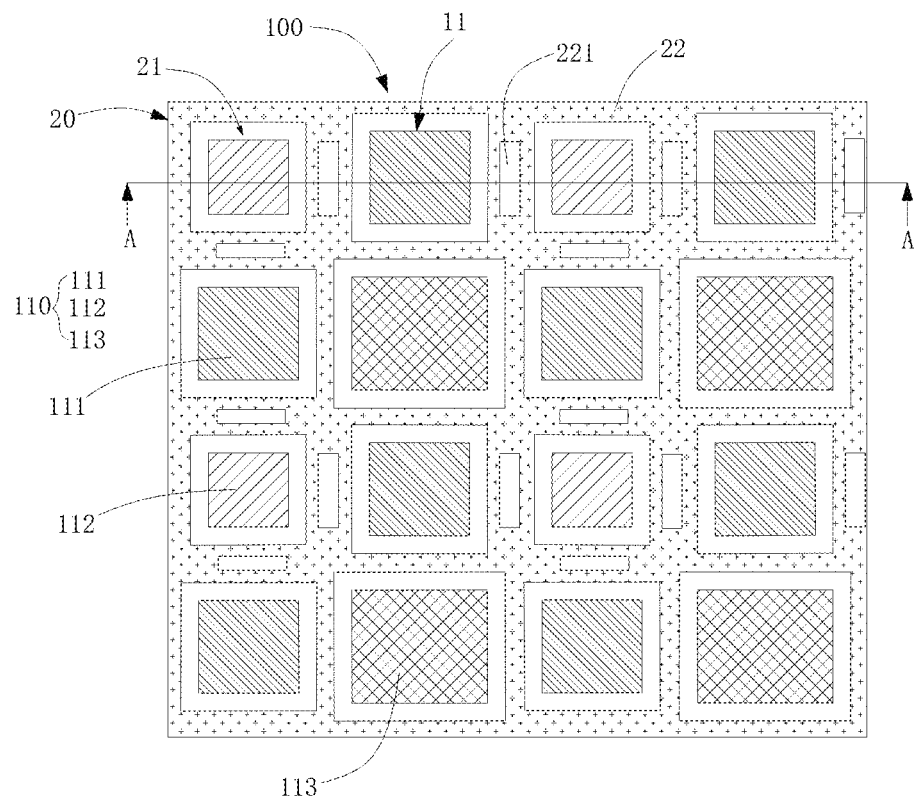
FIG. 1 is a schematic view of a touch display panel according to a first embodiment of the present application.

The technical solutions of the present application are clearly and completely described below with reference to the accompanying drawings and in conjunction with specific embodiments. Obviously, the described embodiments are only some of the embodiments of the present application, but not all of the embodiments. Based on the embodiments in the present application, all other embodiments obtained by those skilled in the art without creative work shall be deemed to fall within the protection scope of the present application.

In the present application, it should be understood that directional terms such as "center", "longitudinal", "transverse", "length", "width", "thickness", "upper", "lower", "front", "rear", "left", "right", "vertical", "horizontal", "top", "bottom", "inside", and "outside" are based on orientation or positional relationship shown in the drawings. The directional terms are only for the convenience of describing the present application and simplifying the description, rather than indicating or implying that the indicated device or element must have a specific orientation, be constructed and operated in a specific orientation, and therefore should not be construed as a limitation on the present application. In addition, the terms "first" and "second" are only used for illustrative purposes, and should not be construed as indicating or implying relative importance or implying the number of indicated technical features. Thus, features defined by "first" and "second" can expressly or implicitly include one or more features. In the description of the present application, "multiple" means two or more, unless otherwise definitely and specifically defined.

In the present application, the wording "exemplary" is used to mean "serving as an example, a case, or illustration." Any embodiment described in this application as "an exemplary embodiment" is not necessarily to be construed as being preferred or advantageous over other embodiments. The following description is provided to enable any person skilled in the art to make and use the present application. In the following description, details are set forth for the purpose of explanation. It should be understood that one of ordinary skill in the art can realize that the present application can be carried out without the use of these specific details. In other instances, well-known structures and procedures are not described in detail so as not to obscure the description of the present application with unnecessary detail. Therefore, the present application is not intended to be limited to the embodiments shown but is to be accorded the widest scope consistent with the principles and features disclosed herein. Unless otherwise specified, being parallel or perpendicular in the orientations in the present application does not mean being parallel or perpendicular in the strict sense, and it will do as long as the corresponding structure can achieve the intended purposes.

The present application provides a touch display panel, which is described in detail below. It should be noted that the description order of the following embodiments is not intended to limit the preferred order of the embodiments of the present application. The touch display panel of the present application can be used in a liquid crystal display device and an organic light-emitting diode (OLED) display device.

Figure 2:
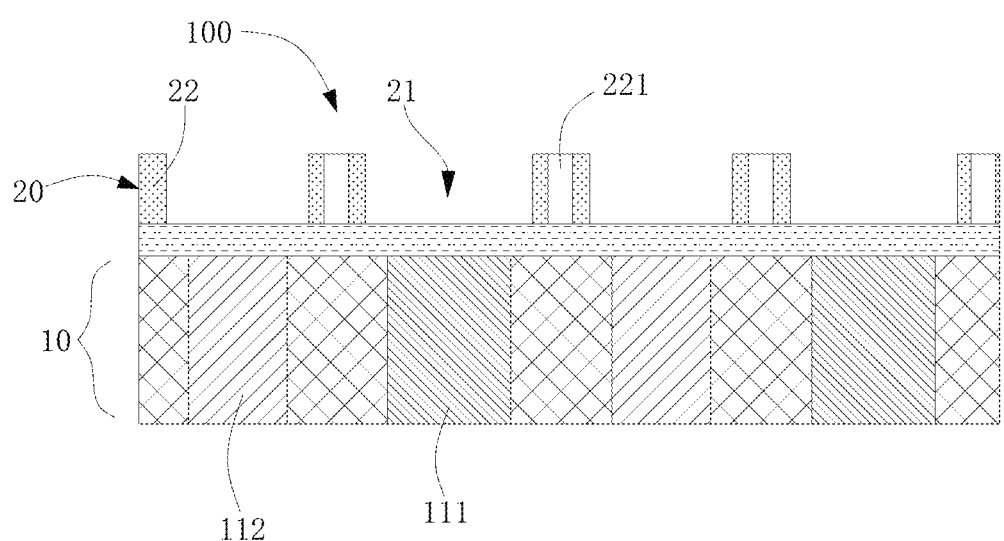
FIG. 2 is a sectional view taken along line A-A in FIG. 1.
Figure 3:
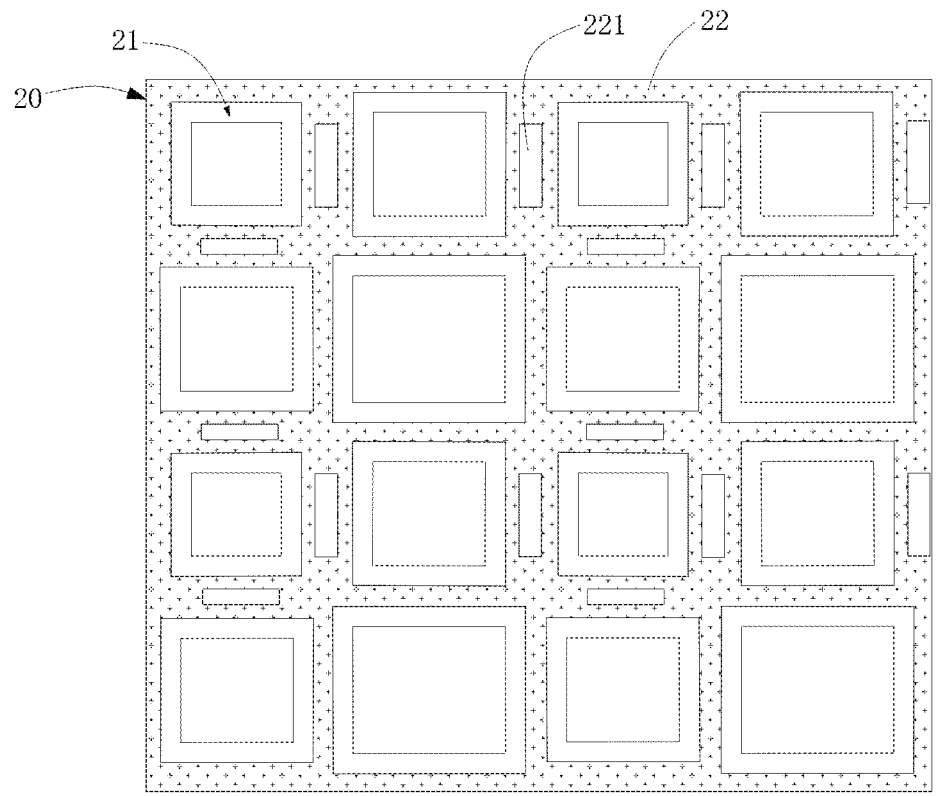
FIG. 3 is a schematic view of a mesh electrode of the touch display panel according to the first embodiment of the present application.

Please refer to FIGS. 1 to 3. FIG. 1 is a schematic view of a touch display panel 100 according to a first embodiment of the present application. FIG. 2 is a cross-sectional view taken along line A-A in FIG. 1. FIG. 3 is a schematic view of a mesh electrode 20 of the touch display panel 100 according to the first embodiment of the present application. The present application provides a touch display panel 100, which includes: an array substrate, a display light-emitting layer 10, and a mesh electrode 20.

The display light-emitting layer 10 is disposed on the array substrate, and the display light-emitting layer 10 includes a plurality of sub-pixel units 11 arranged spaced apart. The sub-pixel unit 11 includes at least one sub-pixel 110. The mesh electrode 20 is arranged on a light-emitting side of the display light-emitting layer 10, and a plurality of grid units 21 of the mesh electrode 20 surround the sub-pixel units 11.

Specifically, in the present embodiment, a structure of the touch display panel 100 in the present application is described in detail by taking as an example that the sub-pixel unit 11 includes one sub-pixel 110. The sub-pixel 110 include a first sub-pixel 111, a second sub-pixel 112, and a third sub-pixel 113. That is to say, in the present embodiment, the sub-pixel unit 11 includes any one of the first sub-pixel 111, the second sub-pixel 112, and the third sub-pixel 113.

The array substrate is a thin film transistor array substrate commonly used in conventional techniques. The array substrate can be set using conventional techniques, and a detailed description thereof is not provided here for brevity. In the present application, an organic light-emitting display is used as a specific example for description. To be specific, the display light-emitting layer 10 includes an organic light-emitting layer, and the organic light-emitting layer includes multiple sub-pixel units 11 arranged in an array. The mesh electrode 20 is disposed on the light-emitting side of the organic light-emitting layer.

Specifically, the grid units 21 of the mesh electrode 20 are arranged in one-to-one correspondence with the sub-pixel units 11. That is to say, each grid unit 21 of the mesh electrode 20 is provided with one sub-pixel unit 11. Multiple pixel units 11 are disposed in the display light-emitting layer 10. The pixel units are arranged in an array to constitute the display light-emitting layer 10 of the display panel. Specifically, the sub-pixel 110 can include a first sub-pixel 111, a second sub-pixel 112, and a third sub-pixel 113. An area formed by the sub-pixel units 11 is a light-emitting area, and an area formed between two adjacent sub-pixel units 11 is a non-light-emitting area. The mesh electrode 20 is arranged in the non-light-emitting area formed among the sub-pixel units 11. After arrangement of the mesh electrode 20 is completed, the sub-pixel units 11 are located in the grid units 21 of the mesh electrode 20. In addition, the sub-pixel units 11 can be arranged in an array to form a pattern like any one of a pinwheel, a tripod, pearls, or a diamond, and can have any other type of array arrangement.

A difference between any two of the shortest distances on a display plane from different points of an outer contour of each sub-pixel unit 11 to the corresponding grid unit 21 of the mesh electrode 20 is greater than or equal to 0 micrometer (μm) and less than or equal to 1 μm. A difference between any two of the shortest distances on the display plane from points on the outer contours of different sub-pixel units 11 to the respectively corresponding grid units 21 of the mesh electrode 20 is greater than or equal to 0 μm and less than or equal to 1 μm.

In order to solve a problem that the display panel has a large color shift in a side viewing direction, the applicant analyzed many factors that can cause the display panel to have a large color shift in the side viewing direction. For example, thicknesses, materials, and flatness of film layers, and pixel shapes, pixel distribution, polarizer orientation, and other factors are tested and analyzed to finally determine that a conventional display panel has a large color shift in the side viewing direction due to uneven distances between metal grid units and sub-pixels.

Therefore, the present application is configured such that on the display plane, the difference between any two of the shortest distances from different points of the outer contour of each sub-pixel unit 11 to the corresponding grid unit 21 of the mesh electrode 20 is greater than or equal to 0 micrometer (μm) and less than or equal to 1 μm. Furthermore, on the display plane, the difference between any two of the shortest distances from points on the outer contours of different sub-pixel units 11 and the grid units 21 of the mesh electrode 20 is greater than or equal to 0 μm and less than or equal to 1 μm. That is to say, on the display plane, the shortest distance from any point on the outer contours of any two of the sub-pixel units 11 to the corresponding grid unit 21 of the mesh electrode 20 is very close or even equal, so that the brightness displayed by each sub-pixel unit 11 at the side viewing direction is relatively uniform, especially the brightness displayed by the sub-pixels of different colors at the side viewing direction is moare uniform, thereby solving the problem of large color shift of the display panel in the side viewing direction (at side viewing angles).

Please refer to the following table, which is a comparison table showing the shortest distance between the sub-pixel unit 11 of the prior art and the grid unit 21 of the mesh electrode 20 of a prior art and the shortest distance between the sub-pixel unit 11 of the present application and the grid unit 21 of the mesh electrode 20 of the present application. In the comparison table, H is the shortest distance on the display plane between a point on the outer contour of the sub-pixel 11 and the grid unit 21 of the mesh electrode 20. The sub-pixel unit 11 includes one sub-pixel 110, and the sub-pixel 110 is any one of a red sub-pixel, a green sub-pixel, and a blue sub-pixel. This embodiment is an example for illustration.

| | H of the prior art | H of the present application |
|---|---|---|
| red sub-pixel | 12.36 | 8.15 |
| green sub-pixel | 8.15 | 8.15 |
| blue sub-pixel | 12.36 | 8.15 |

Figure 4:
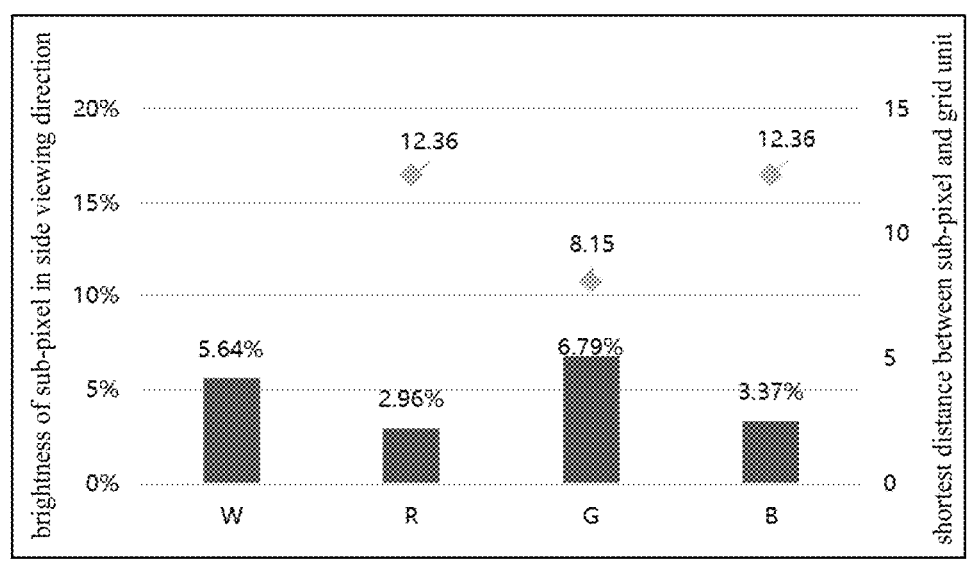
FIG. 4 is a brightness comparison diagram of a conventional touch display panel and its sub-pixels in a side view direction.

Please refer to 4. FIG. 4 is a brightness comparison diagram of a conventional touch display panel and its sub-pixels when viewed in a side viewing direction. The conventional touch display panel adopts the parameters in the above table. That is to say, in the conventional touch display panel, the shortest distance on the display plane between the point on the outer contour of the red sub-pixel and the grid unit 21 of the mesh electrode 20 is 12.36, the shortest distance on the display plane between the point on the outer contour of the green sub-pixel and the grid unit 21 of the mesh electrode 20 is 8.15, and the shortest distance on the display plane between the point on the outer contour of the blue sub-pixel and the grid unit 21 of the mesh electrode 20 is 12.36. The brightness parameters of the sub-pixel unit 11 of the display panel in the side viewing direction are obtained as follows: the brightness displayed by the red sub-pixel is 2.96%, the brightness displayed by the green sub-pixel is 6.79%, and the brightness displayed by the blue sub-pixel is 3.37%; and the average brightness displayed by the display panel when viewed in the side viewing direction is 5.64%. Accordingly, it can be known that the brightness displayed by the sub-pixel 11 in the side viewing direction of the conventional touch display panel is not uniform enough, and there is a large color shift.

Figure 5:
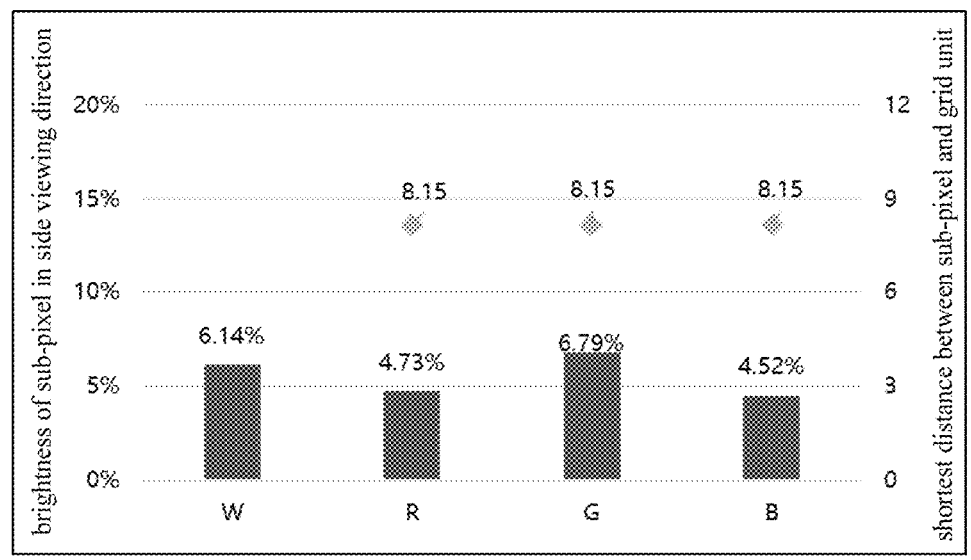
FIG. 5 is a brightness comparison diagram of the touch display panel of the present application and its sub-pixels in a side viewing direction.

Please refer to 5. FIG. 5 is a brightness comparison diagram of the touch display panel of the present application and its sub-pixels in a side viewing direction. The touch display panel of the present application adopts the parameters in the above table. That is to say, the shortest distance on the display plane between the point on the outer contour of the red sub-pixel and the grid unit 21 of the mesh electrode 20 is 8.15, and the shortest distance on the display plane between the point on the outer contour of the green sub-pixel and the grid unit 21 of the mesh electrode 20 is 8.15, and the shortest distance on the display plane between the point on the outer contour of the blue sub-pixel and the grid unit of the mesh electrode 20 are 8.15. The brightness parameters of the sub-pixel unit 11 of the display panel in the side viewing direction are obtained as follows: the brightness displayed by the red sub-pixel is 4.73%, and the brightness displayed by the green sub-pixel is 6.79%, the brightness displayed by the blue sub-pixel is 4.52%, and the brightness displayed by the display panel when viewed in the side viewing direction is 6.14%. Accordingly, it can be known that the brightness displayed by the sub-pixels 11 in the side viewing direction of the touch display panel of the present application is relatively uniform, and the color shift is small. In addition, the brightness displayed by the touch display panel of the present application in the side viewing direction is higher than the brightness displayed by the conventional touch display panel in the side viewing direction (viewed from the sides).

The first sub-pixel 111, the second sub-pixel 112, and the third sub-pixel 113 are respectively one of a red sub-pixel, a green sub-pixel, and a blue sub-pixel. The first sub-pixel 111, the second sub-pixel 112, and the third sub-pixel 113 are of different colors from each other. Since light-emitting efficiencies of the red sub-pixel, the green sub-pixel, and the blue sub-pixel are different, light-emitting areas of the red sub-pixel, the green sub-pixel, and the blue sub-pixel are also different. When the display panel adopts the configuration of the present application, the shortest distances on the display plane from any two points on the outer contour of each sub-pixel unit 11 to the corresponding grid unit 21 of the mesh electrode 20 are equal, and the shortest distances on the display plane from the points on the outer contours of the different sub-pixel units 11 to the respectively corresponding grid units 21 of the mesh electrode 20 are equal. In order to realize the above configuration, portions of the grid lines of the mesh electrode 20 have greater widths, which increases a capacitance value of a capacitor formed by the mesh electrode 20. In order to solve the problem that the capacitance value of the capacitor formed by the mesh electrodes 20 increases, in some embodiments, through holes 221 are defined in the grid lines 22 of the mesh electrode 20, so that the capacitance value of the capacitor formed by the mesh electrodes 20 can be adjusted through the through holes 221. Specifically, the through holes 221 can be defined on the grid lines 22 of greater widths in the mesh electrode 20, or the through holes 221 can be defined on all grid lines 22 of the mesh electrode 20, so as to adjust the capacitance value of the capacitor formed by the mesh electrode 20.

Figure 6:
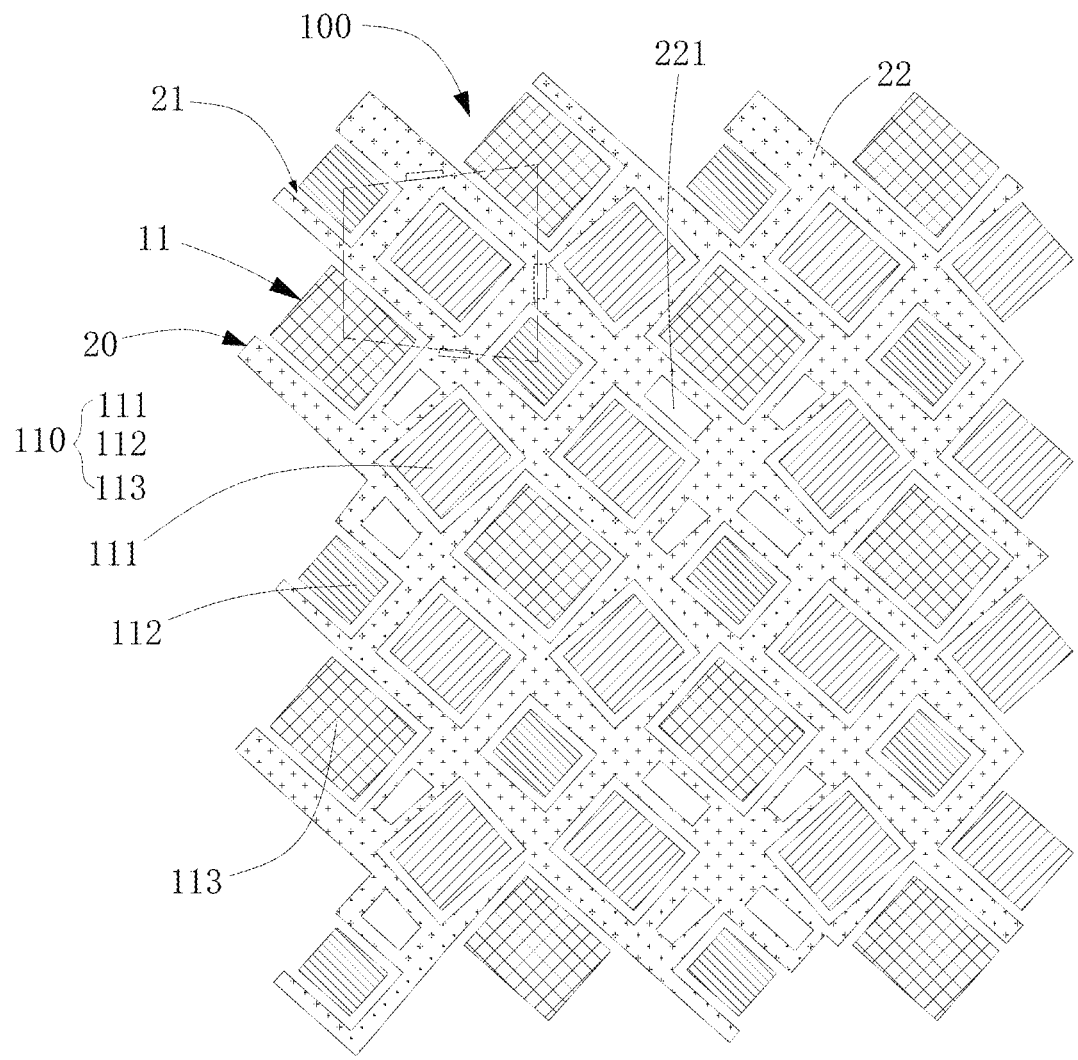
FIG. 6 is a schematic view of the touch display panel according to a second embodiment of the present application.

Please refer to FIG. 1 and FIG. 6. FIG. 6 is a schematic view of the touch display panel 100 according to a second embodiment of the present application. The sub-pixel units in FIG. 6 are arranged in a tripod-shaped arrangement. After testing and analysis by the applicant, in the prior art, the display panel in which the sub-pixel units are arranged in a tripod-shaped (isosceles trapezoidal shaped) arrangement also has the problem of large color shift when viewed in the side viewing direction. In the display panel having the sub-pixel units arranged in the tripod arrangement, the distances between the grid lines 22 of the mesh electrode 20 and the sub-pixels are not uniform. In particular, the differences between the distances from the grid lines 22 of the mesh electrode 20 to the sub-pixels of different colors are great. In view of this, it is very necessary for the conventional display panel in which the sub-pixel units are arranged in a tripod shaped arrangement to use the technical solution of the present application to solve the problem of large color shift at the side viewing angles.

The touch display panel 100 shown in FIGS. 1 and 6 adopts the same configuration. That is to say, the difference between any two of the shortest distances on the display plane from different points of the outer contour of each sub-pixel unit 11 to the corresponding grid unit 21 of the mesh electrode 20 is greater than or equal to 0 μm and less than or equal to 1 μm. Further, the difference between any two of the shortest distances on the display plane from the points on the outer contours of different sub-pixel units 11 to the respectively corresponding grid units 21 of the mesh electrode 20 is greater than or equal to 0 μm and less than or equal to 1 μm.

Further, in some embodiments, when a ratio of a shortest distance between two adjacent sub-pixel units 11 to a line width of the grid line 22 of the mesh electrode 20 between the two adjacent sub-pixel units 11 is less than 10/3, the through hole is defined in the grid line 22 of the mesh electrode 20 between the two adjacent sub-pixel units 11. In other words, in the present application, it is not necessary to have the through holes in all the grid lines of the mesh electrode. Only when the width of the grid line of the mesh electrode is greater than a certain amount, the grid line is provided with the through hole. Specifically, only when the ratio of the shortest distance between the two adjacent sub-pixel units to the line width of the grid line of the mesh electrode between the two adjacent sub-pixel units is less than 10/3, the through hole is defined in the grid line of the mesh electrode, so that less through holes are required, which is beneficial to reduce the production costs. It can be known from FIG. 1 and FIG. 6 that not all the grid lines of the mesh electrode are provided with the through hole, and only when the line width of the grid line of the mesh electrode is relatively large, the through hole is defined in the grid line.

Referring to FIG. 6, in some embodiments, the sub-pixel unit 11 includes a first sub-pixel unit, a second sub-pixel unit and a third sub-pixel unit. Lines connecting centers of two second sub-pixel units and two third sub-pixel units located around one first sub-pixel unit form a virtual isosceles trapezoid. The center of the first sub-pixel unit is located at an intersection of a perpendicular bisector of the line connecting the centers of the two surrounding second sub-pixel units and a perpendicular bisector of the line connecting the centers of the two surrounding third sub-pixel units. The centers of the second sub-pixel units and the centers of the third sub-pixel units located around the first sub-pixel unit respectively coincide with vertices of the virtual isosceles trapezoid. When the line connecting the centers of the second sub-pixel unit and the third sub-pixel unit adjacent to each other is a long base of the virtual isosceles trapezoid, the through hole 221 is defined in the grid line 22 of the mesh electrode 20, which is located between the second sub-pixel unit and the third sub-pixel unit adjacent to each other.

The first sub-pixel unit includes the first sub-pixel 111, the second sub-pixel unit includes the second sub-pixel 112, and the third sub-pixel unit includes the third sub-pixel 113. The first sub-pixel 111 is a green sub-pixel, the second sub-pixel 112 is a red sub-pixel, and the third sub-pixel 113 is a blue sub-pixel.

In the tripod-shaped arrangement for the sub-pixel units, distances between sub-pixel units are not uniform, and differences between the distances between different sub-pixel units are great. In this case, the line width of the corresponding grid line of the mesh electrode is greater. Therefore, in order to solve the problem that the line width of the grid line of the mesh electrodes is great, the grid line of the mesh electrode is provided with the through hole. Specifically, because the distance between the second sub-pixel unit and the third sub-pixel unit adjacent to each other and located at the two ends of the long base of the virtual isosceles trapezoid is relatively long, the through hole 221 is defined in the grid line 22 of the mesh electrode 20, which is located between the second sub-pixel unit and the third sub-pixel unit at the two ends of the long base of the virtual isosceles trapezoid, thereby adjusting the capacitance value of the capacitor formed by the mesh electrode 20.

Further, when the line connecting the centers of the second sub-pixel unit and the third sub-pixel unit adjacent to each other is located at a waist of the virtual isosceles trapezoid, the through hole 221 is defined in the grid line 22 of the mesh electrode 20, which is located between the second sub-pixel unit and the third sub-pixel unit adjacent to each other. Since a length of the waist of the virtual isosceles trapezoid is also relatively long, the through hole 221 is defined in the grid line 22 of the mesh electrode 20, which is located between the second sub-pixel unit and the third sub-pixel unit at two ends of the waist of the virtual isosceles trapezoid. Accordingly, the present application can adjust the capacitance value of the capacitor formed by the mesh electrode 20.

Further, in some embodiments, an inner contour of a cross-section of the grid unit 21 of the mesh electrode 20 on the display plane has a shape same as a shape of a cross-section of the sub-pixel unit 11 located in the grid unit 21 of the mesh electrode 20 on the display plane. In this way, it can be ensured that the shortest distances on the display plane from any two points on the outer contour of each of the sub-pixel units 11 and the grid unit 21 of the mesh electrode 20 are the same.

In some embodiments of the present application, the sub-pixel 110 can be a first sub-pixel 111, a second sub-pixel 112, or a third sub-pixel 113. That is to say, the sub-pixel unit 11 includes any one of the first sub-pixel 111, the second sub-pixel 112, and the third sub-pixel 113. Cross-sections of the first sub-pixel 111, the second sub-pixel 112, and the third sub-pixel 113 have a same shape on the display plane. Specifically, the cross-sections of the first sub-pixel 111, the second sub-pixel 112, and the third sub-pixel 113 on the display plane are square-shaped, circular-shaped, or elliptical-shaped. Referring to FIGS. 1 and 2, it can be known from FIGS. 1 and 2 that the cross-sections of the first sub-pixel 111, the second sub-pixel 112, and the third sub-pixel 113 on the display plane are square-shaped. The inner contour of the cross-section of the grid unit 21 of the mesh electrode 20 on the display plane is also square-shaped.

When the cross-sections of the first sub-pixel 111, the second sub-pixel 112, and the third sub-pixel 113 on the display plane are of the same shape, it is beneficial to improve the efficiency of manufacturing the first sub-pixel 111, the second sub-pixel 112, and the third sub-pixel 113. However, the shape of the first sub-pixel 111, the shape of the second sub-pixel 112, and the shape of the third sub-pixel 113 are not complementary shapes. In this case, the width of the grid line 22 of the mesh electrode 20 is greater, so it is necessary to have through holes 221 in all the grid lines 22 of the mesh electrode 20, so as to adjust the capacitance value of the capacitor formed by the mesh electrode 20.

Figure 7:
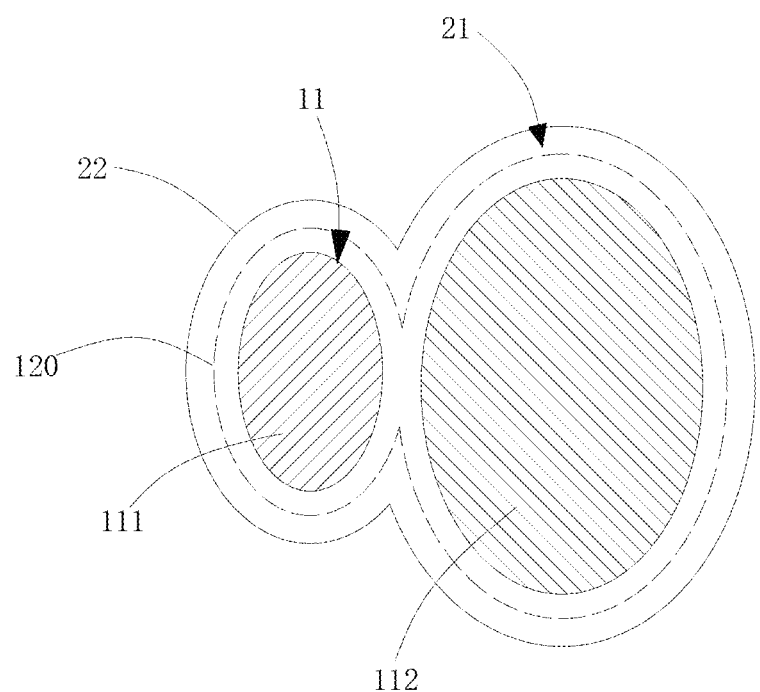
FIG. 7 is a schematic view of a first embodiment of a sub-pixel unit of the touch display panel according to the present application.
Figure 8:
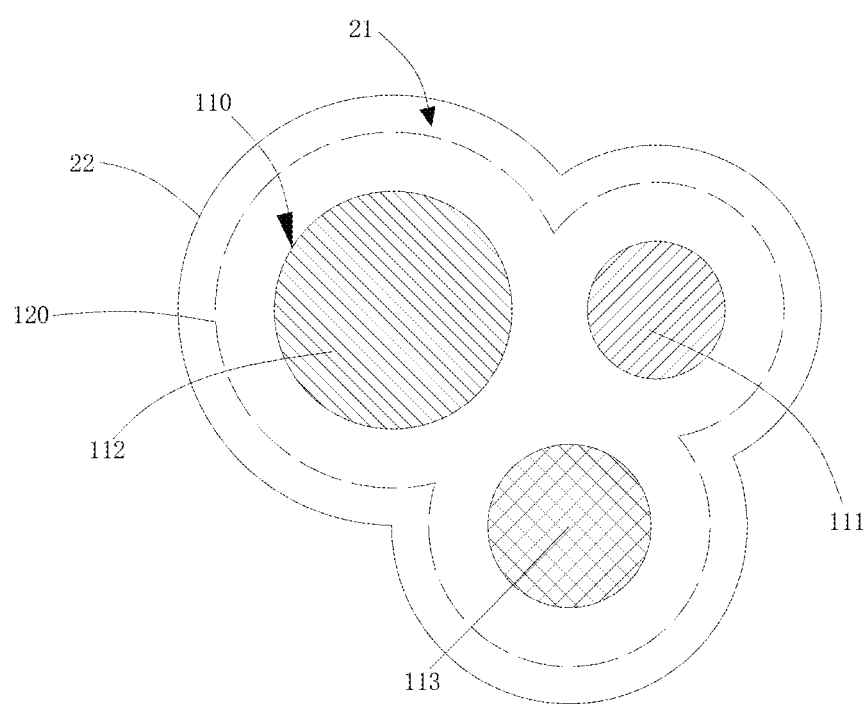
FIG. 8 is a schematic view of a second embodiment of the sub-pixel unit of the touch display panel according to the present application.

Please refer to FIGS. 7 and 8. FIG. 7 is a schematic view of a first embodiment of the sub-pixel unit of the touch display panel 100 according to the present application, and FIG. 8 is a second embodiment of the sub-pixel unit of the touch display panel 100 according to the present application. In some embodiments, the sub-pixel unit 11 includes at least two sub-pixels. An outer contour of each of the at least two sub-pixels scales up to extend outward to form a virtual contour, and the virtual contours of any two of the at least two sub-pixels intersect with each other. The outer contour of the sub-pixel unit 11 is an outer contour formed by the union of the virtual contours of the at least two sub-pixels.

When the sub-pixel unit 11 includes multiple sub-pixels, the outer contour of the sub-pixel unit 11 is the outer contour formed by the union of the virtual contours of the at least two sub-pixels. The brightness displayed by the sub-pixel units 11 in the side viewing direction is relatively uniform, especially the brightness displayed by the sub-pixels of different colors in the side viewing direction is relatively uniform, thereby solving the problem of large color shift of the display panel in the side viewing direction.

It should be noted that, in other embodiments of the present application, the embodiment in FIG. 1 can be combined with the embodiment in FIG. 7 or FIG. 8. That is to say, some grid lines surround a single sub-pixel, and some grid lines surround multiple sub-pixels, and the arrangement is made in a manner to enable the entire display panel to show uniformity as a whole, so as to take into account the optical performance and the electrical requirements for touch control.

Specifically, referring to FIG. 7, the sub-pixel unit 11 includes two sub-pixels 110, the two sub-pixels 110 are one first sub-pixel 111 and one second sub-pixel 112 respectively. The outer contour of each of the two sub-pixels scales up to extend outward to form a virtual contour 120, and the virtual contours 120 of the two sub-pixels intersect with each other. The outer contour of the sub-pixel unit 11 is an outer contour formed by the union of the virtual contours 120 of the two sub-pixels. The first sub-pixel 111 and the second sub-pixel 112 can be of the same color or different colors.

Please refer to FIG. 8. In FIG. 8, the sub-pixel unit 11 includes three sub-pixels 110. The three sub-pixels 110 are one first sub-pixel 111, one second sub-pixel 112, and one third sub-pixel 113 respectively. The outer contour of each of the three sub-pixels 110 scales up to expand outward to form a virtual contour 120, and the virtual contours 120 of any two of the three sub-pixels 110 intersect with each other. The outer contour of the sub-pixel unit 11 is an outer contour formed by the union of the virtual contours 120 of the three sub-pixels 110. The first sub-pixel 111, the second sub-pixel 112, and the third sub-pixel 113 can be of the same color or different colors. Any two of the first sub-pixel 111, the second sub-pixel 112, and the third sub-pixel 113 can also be of different colors.

Figure 9:
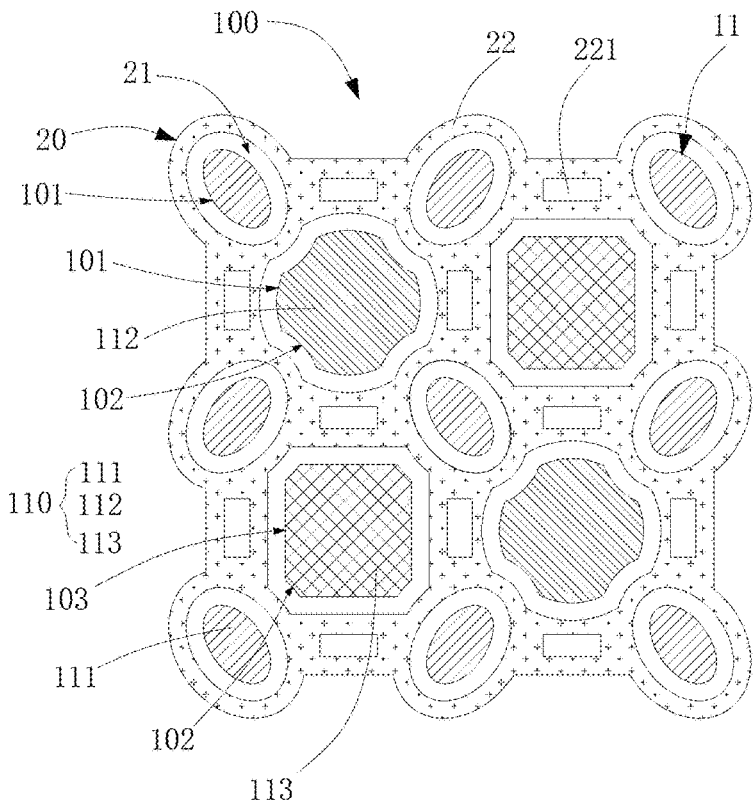
FIG. 9 is a schematic view of the touch display panel according to a third embodiment of the present application.

Please refer to FIG. 9, which is a schematic view of the touch display panel 100 according to a third embodiment of the present application. Each sub-pixel 110 can be one first sub-pixel 111, one second sub-pixel 112, or one third sub-pixel 113. To be specific, the sub-pixel unit 11 includes any one of the first sub-pixel 111, the second sub-pixel 112, and the third sub-pixel 113. The cross-sections of the first sub-pixel 111, the second sub-pixel 112, and the third sub-pixel 113 have different shapes on the display plane.

Specifically, in the present embodiment, the shape of the cross-section of the first sub-pixel 111 on the display plane includes an outward convex arc 101. The shape of the cross-section of the second sub-pixel 112 or the third sub-pixel 113 on the display plane is a polygon including an inward concave arc 102 and a straight line 103. The shape of the cross-section of the third sub-pixel 113 or the second sub-pixel 112 on the display plane is a polygon including the inward concave arc 102 and the outward convex arc 101. The inward concave arc 102 of the second sub-pixel 112 or the third sub-pixel 113 is arranged corresponding to the outward convex arc 101 of the first sub-pixel 111. In a pair of the inward concave arc 102 and the outward convex arc 101 arranged corresponding to each other, a concaving direction of the inward concave arc 102 is the same as an outward protruding direction of the outward convex arc 101.

Specifically, the shape of the cross-section of the second sub-pixel 112 on the display plane is a polygon including the inward concave arc 102 and the straight line 103, and the shape of the cross-section of the third sub-pixel 113 on the display plane is a polygon including the inward concave arc 102 and the outward convex arc 101.

That is to say, the inward concave arc 102 of the second sub-pixel 112 or the third sub-pixel 113 are arranged in a position corresponding to the outward convex arc 101 of the first sub-pixel 111, so the present application can reduce a distance between the first sub-pixel 111 and the second sub-pixel 112 and a distance between the first sub-pixel 111 and the third sub-pixel 113, reduces unnecessary space. As a result, aperture ratios of the first sub-pixel 111, the second sub-pixel 112, and the third sub-pixel 113 are improved.

Since the inner contour of the cross-section of the grid unit 21 of the mesh electrode 20 on the display plane has the same shape as the shape of the cross-section of the sub-pixel unit 11 located in the grid unit 21 of the mesh electrode 20 on the display plane, Therefore, when the shape of the cross-section of the third sub-pixel 113 on the display plane consists of the inward concave arc 102 and the outward convex arc 101, the grid line 22 of the mesh electrode 20 includes an outward convex arc in a position corresponding to the outward convex arc of the third sub-pixel 113, thereby the present application can reduce the width of the grid line 22 of the mesh electrode 20 and reduce the capacitance value of the capacitor formed by the mesh electrode 20.

Specifically, in some embodiments, in the grid units 221 of the mesh electrode 20, the through hole 221 is defined in the grid line 22 corresponding to the straight line 103 of the second sub-pixel 112 or the third sub-pixel 113. The grid line 22 corresponding to the straight line 103 has a greater line width. By means of the through hole 221, the capacitance value of the capacitor formed by the mesh electrode 20 can be adjusted to solve the problem that the capacitance value of the capacitor formed by the mesh electrode 20 increases.

Specifically, in some embodiments, in the grid units 21 of the mesh electrode 20, the through hole is defined in the grid line 22 corresponding to the outward convex arc 101 of the third sub-pixel 113 or the second sub-pixel 112. Although the outward convex arc 101 can reduce the width of the grid line 22 of the mesh electrode 20, the through hole 221 can be defined in the grid line 22 corresponding to the outward convex arc 101 in order to further reduce the capacitance value of the capacitor formed by the mesh electrode 20.

Specifically, the cross-section of the first sub-pixel 111 on the display plane is circular-shaped or elliptical-shaped.

In some embodiments, four first sub-pixels 111 are arranged around a circumference of each of the second sub-pixels 112 and are arranged at intervals corresponding to equal arcs of the circumference of the second sub-pixels 112. The shape of the cross-section of the second sub-pixel 112 on the display plane is an octagon including four inward concave arcs 102 and four straight lines 103.

In some embodiments, four first sub-pixels 111 are arranged around the circumference of each of the third sub-pixels 113 and arranged at intervals corresponding to equal arcs of the circumference of the third sub-pixels 113. The shape of the cross-section of the third sub-pixel 113 on the display plane is an octagon including four inward concave arcs 102 and four outward convex arcs 101.

Figure 10:
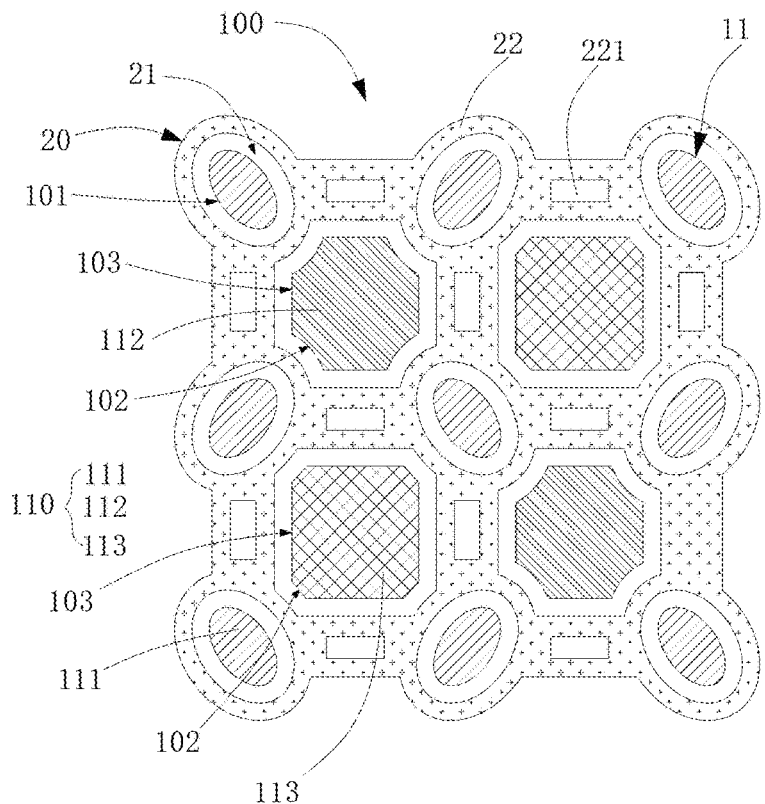
FIG. 10 is a schematic view of the touch display panel according to a fourth embodiment of the present application.

Please refer to FIG. 10, which is a schematic view of the touch display panel 100 according to a fourth embodiment of the present application. The present embodiment is different from the touch display panel 100 shown in FIG. 9 in that the shape of the cross-section of the first sub-pixel 111 on the display plane includes an outward convex arc 101, the shapes of the cross-sections of the second sub-pixel 112 and the third sub-pixel 113 on the display plane are both a polygon including an inward concave arc 102 and a straight line 103. The inward concave arcs 102 of the second sub-pixel 112 and the third sub-pixel 113 are each arranged corresponding to the outward convex arc 101 of the first sub-pixel 111. In a pair of the inward concave arc 102 and the outward convex arc 101 arranged corresponding to each other, a concaving direction of the inward concave arc 102 is the same as an outward protruding direction of the outward convex arc 101.

In the present application, the inward concave arcs 102 and the outward convex arcs 101 are arranged in a one-to-one correspondence. In a pair of the inward concave arc 102 and the outward convex arc 101 arranged corresponding to each other, the concaving direction of the inward concave arc 102 is the same as the outward protruding direction of the outward convex arc 101, so that the distance between the first sub-pixel 111 and the second sub-pixel 112 and the distance between the first sub-pixel 111 and the third sub-pixel 113 can be reduced, thereby reducing unnecessary space. As a result, the aperture ratios of the first sub-pixel 111, the second sub-pixel 112, and the third sub-pixel 113 can be increased.

Specifically, in some embodiments, in the grid units 221 of the mesh electrode 20, the through hole 221 is defined in the grid line 22 corresponding to the straight line 103 of the second sub-pixel 112 or the third sub-pixel 113. The grid line 22 corresponding to the straight line 103 has a greater line width. By means of the through hole 221, the capacitance value of the capacitor formed by the mesh electrode 20 can be adjusted to solve the problem that the capacitance value of the capacitor formed by the mesh electrode 20 increases.

Specifically, the cross-section of the first sub-pixel 111 on the display plane is circular-shaped or elliptical-shaped. In some embodiments, four first sub-pixels 111 are arranged around a circumference of each of the second sub-pixels 112 and the third sub-pixels 113 and arranged at intervals corresponding to equal arcs of the circumference. The shape of the cross-section of the second sub-pixel 112 and the shape of the cross-section of the third sub-pixel 113 on the display plane are both an octagon including four inward concave arcs 102 and four straight lines 103.

Figure 11:
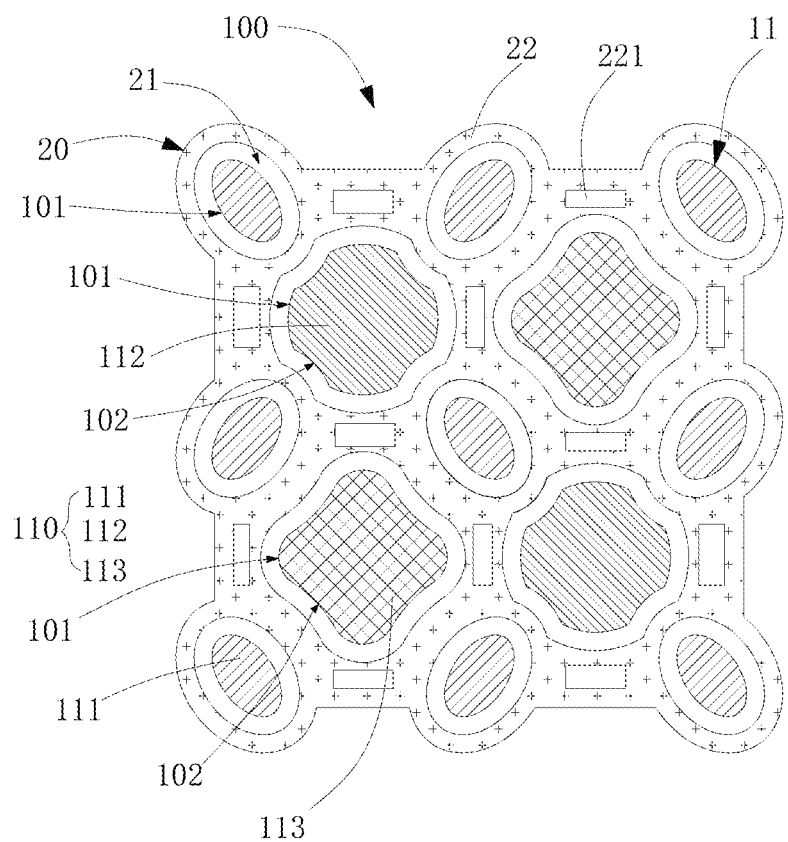
FIG. 11 is a schematic view of the touch display panel according to a fifth embodiment of the present application.

Please refer to FIG. 11, which is a schematic view of the touch display panel 100 according to a fifth embodiment of the present application. The present embodiment is different from the touch display panel 100 shown in FIG. 9 in that the shape of the cross-section of the first sub-pixel 111 on the display plane includes an outward convex arc 101. Furthermore, the shapes of the cross-sections of the second sub-pixel 112 and the third sub-pixel 113 on the display plane are both a polygon including an inward concave arc 102 and an outward convex arc 101. The inward concave arcs 102 of the second sub-pixel 112 and the third sub-pixel 113 are each arranged corresponding to the outward convex arc 101 of the first sub-pixel 111. In a pair of the inward concave arc 102 and the outward convex arc 101 arranged corresponding to each other, a concaving direction of the inward concave arc 102 is the same as an outward protruding direction of the outward convex arc 101.

The inner contour of the cross-section of the grid unit 21 of the mesh electrode 20 on the display plane has a shape the same as a shape of a cross-section of the sub-pixel unit 11 located in the grid unit 21 of the mesh electrode 20 on the display plane. Therefore, when the shapes of the cross-sections of the second sub-pixel 112 and the third sub-pixel 113 on the display plane are both a shape consisting of an inward concave arc 102 and an outward convex arc 101, the grid lines 22 of the mesh electrode 20 include inward concave arcs in positions corresponding to the outward convex arcs 101 of the second sub-pixel 112 and the third sub-pixel 113, thereby the present application can reduce the width of the grid line 22 of the mesh electrode 20 and further reduce the capacitance value of the capacitor formed by the mesh electrode 20.

Specifically, in some embodiments, in the grid units 221 of the mesh electrode 20, the through holes 221 are defined in the grid lines 22 corresponding to the outward convex arcs 101 of the second sub-pixel 112 and the third sub-pixel 113. The grid lines 22 corresponding to the outward convex arcs 101 of the second sub-pixel 112 and the third sub-pixel 113 have a greater line width. By means of the through holes 221, the capacitance value of the capacitor formed by the mesh electrode 20 can be adjusted to solve the problem that the capacitance value of the capacitor formed by the mesh electrode 20 increases.

Specifically, the cross-section of the first sub-pixel 111 on the display plane is circular-shaped or elliptical-shaped. In some embodiments, four first sub-pixels 111 are arranged around the circumference of each of the third sub-pixels 113 and arranged at intervals corresponding to equal arcs of the circumference of the third sub-pixels 113. The shape of the cross-section of the third sub-pixel 113 on the display plane is an octagon including four inward concave arcs 102 and four outward convex arcs 101.

The present application also provides a touch display device including the above touch display panel 100.

The touch display device provides similar solutions to solve the problem as the above-mentioned touch display panel 100. Therefore, for the embodiments and advantages of the touch display device, reference can be made to the description of the above-mentioned touch display panel 100, and a detailed description is not repeated herein.

A touch display panel of the present application is described in detail above. Working principles and embodiments of the present application are described in the present disclosure using specific examples. The above embodiments are only used for ease of understanding the method and main ideas of the present application. Those skilled in the art can change the embodiments and the application range according to the ideas of the present application. To sum up, the present disclosure should not be construed as a limitation to the present application.

What is claimed is:

1. A touch display panel, comprising:
a display light-emitting layer, wherein the display light-emitting layer includes a plurality of sub-pixel units arranged at intervals, and each of the sub-pixel units includes at least one sub-pixel; and
a mesh electrode, wherein the mesh electrode is arranged on a light-emitting side of the display light-emitting layer, and grid units of the mesh electrode surround the sub-pixel units;
wherein on a display plane, a difference between any two of shortest distances from different points on an outer contour of each sub-pixel unit and the corresponding grid unit of the mesh electrode is greater than or equal to 0 micrometer and less than or equal to 1 micrometer; and on the display plane, a difference between any two of shortest distances from points on the outer contours of different sub-pixel units to the respectively corresponding grid units of the mesh electrode is greater than or equal to 0 micrometer and less than or equal to 1 micrometer.

2. The touch display panel according to claim 1, wherein a plurality of through holes are defined in the grid lines of the mesh electrode.

3. The touch display panel according to claim 2, wherein when a ratio of a shortest distance between two adjacent sub-pixel units to a line width of the grid line of the mesh electrode between the two adjacent sub-pixel units is less than 10/3, at least one through hole is defined in the grid line of the mesh electrode between the two adjacent sub-pixel units.

4. The touch display panel according to claim 2, wherein the sub-pixel units comprise a plurality of first sub-pixel units, a plurality of second sub-pixel units, and a plurality of third sub-pixel units; and lines connecting centers of two second sub-pixel units and two third sub-pixel units located around one first sub-pixel unit form a virtual isosceles trapezoid, and wherein the center of the first sub-pixel unit is located at an intersection of a perpendicular bisector of the line connecting the centers of the two surrounding second sub-pixel units and a perpendicular bisector of the line connecting the centers of the two surrounding third sub-pixel units; and the centers of the second sub-pixel units and the centers of the third sub-pixel units located around the first sub-pixel unit respectively coincide with vertices of the virtual isosceles trapezoid; and when the line connecting the centers of one second sub-pixel unit and one third sub-pixel unit adjacent to each other is a long base of the virtual isosceles trapezoid, at least one through hole is defined in the grid line of the mesh electrode, which is located between the second sub-pixel unit and the third sub-pixel unit adjacent to each other.

5. The touch display panel according to claim 4, wherein when the line connecting the centers of one second sub-pixel unit and one third sub-pixel unit adjacent to each other is located at a waist of the virtual isosceles trapezoid, at least one through hole is defined in the grid line of the mesh electrode, which is located between the second sub-pixel unit and the third sub-pixel unit adjacent to each other.

6. The touch display panel according to claim 1, wherein each of the sub-pixel units comprises at least two sub-pixels, and wherein an outer contour of each of the at least two sub-pixels scales up to extend outward to form a virtual contour, the virtual contours of any two of the at least two sub-pixels intersect with each other, and the outer contour of the sub-pixel unit is an outer contour formed by the union of the virtual contours of the at least two sub-pixels.

7. The touch display panel according to claim 1, wherein an inner contour of a cross-section of each grid unit of the mesh electrode on the display plane has a same shape as a shape of a cross-section of the sub-pixel located in the grid unit of the mesh electrode on the display plane.

8. The touch display panel according to claim 1, wherein each of the sub-pixel units comprises any one of a first sub-pixel, a second sub-pixel, and a third sub-pixel, and wherein cross-sections of the first sub-pixel, the second sub-pixel, and the third sub-pixel have a same shape on the display plane.

9. The touch display panel according to claim 8, wherein the cross-sections of the first sub-pixel, the second sub-pixel, and the third sub-pixel on the display plane are square-shaped, circular-shaped, or elliptical-shaped.

10. The touch display panel according to claim 1, wherein each of the sub-pixel units comprises any one of a first sub-pixel, a second sub-pixel, and a third sub-pixel: a shape of a cross-section of each first sub-pixel on the display plane comprises an outward convex arc: a shape of a cross-section of each second sub-pixel or each third sub-pixel on the display plane is a polygon comprising an inward concave arc and a straight line: the shape of the cross-section of each third sub-pixel or each second sub-pixel on the display plane is a polygon comprising the inward concave arc and an outward convex arc: the inward concave arc of each second sub-pixel or each third sub-pixel is arranged corresponding to the outward convex arc of one first sub-pixel; and in a pair of one inward concave arc and one outward convex arc arranged corresponding to each other, a concaving direction of the inward concave arc is the same as an outward protruding direction of the outward convex arc.

11. The touch display panel according to claim 1, wherein each of the sub-pixel units comprises any one of a first sub-pixel, a second sub-pixel, and a third sub-pixel: a shape of a cross-section of each first sub-pixel on the display plane comprises an outward convex arc: a shape of a cross-section of each second sub-pixel and a shape of a cross-section of each third sub-pixel on the display plane are both a polygon comprising an inward concave arc and a straight line: the inward concave arcs of one second sub-pixel and one third sub-pixel are each arranged corresponding to the outward convex arc of one first sub-pixel; and in a pair of one inward concave arc and one outward convex arc arranged corresponding to each other, a concaving direction of the inward concave arc is the same as an outward protruding direction of the outward convex arc.

12. The touch display panel according to claim 1, wherein each of the sub-pixel units comprises any one of a first sub-pixel, a second sub-pixel, and a third sub-pixel: a shape of a cross-section of each first sub-pixel on the display plane comprises an outward convex arc: a shape of a cross-section of each second sub-pixel and a shape of a cross-section of each third sub-pixel on the display plane are both a polygon comprising an inward concave arc and an outward convex arc: the inward concave arcs of one second sub-pixel and one third sub-pixel are each arranged corresponding to the outward convex arc of one first sub-pixel; and in a pair of one inward concave arc and one outward convex arc arranged corresponding to each other, a concaving direction of the inward concave arc is the same as an outward protruding direction of the outward convex arc.

13. The touch display panel according to claim 10, wherein the cross-section of each first sub-pixel on the display plane is circular-shaped or elliptical-shaped.

14. The touch display panel according to claim 13, wherein the shape of the cross-section of each second sub-pixel on the display plane is an octagon including four inward concave arcs and four straight lines.

15. The touch display panel according to claim 13, wherein the shape of the cross-section of the third sub-pixel on the display plane is an octagon including four inward concave arcs and four outward convex arcs.

16. The touch display panel according to claim 10, wherein in the grid units of the mesh electrode, the through holes are defined in the grid lines corresponding to the straight lines of the second sub-pixels or the third sub-pixels; and in the grid units of the mesh electrode, the through holes are defined in the grid lines corresponding to the outward convex arcs of the third sub-pixels or the second sub-pixels.

17. The touch display panel according to claim 11, wherein in the grid units of the mesh electrode, the through holes are defined in the grid lines corresponding to the straight lines of the second sub-pixels and the third sub-pixels.

18. The touch display panel according to claim 12, wherein in the grid units of the mesh electrode, the through holes are defined in the grid lines corresponding to the outward convex arcs of the second sub-pixels and the third sub-pixels.

19. The touch display panel according to claim 1, wherein each of the sub-pixel units comprises any one of a first sub-pixel, a second sub-pixel, and a third sub-pixel, and wherein the first sub-pixel, the second sub-pixel, and the third sub-pixel are respectively one of a red sub-pixel, a green sub-pixel, and a blue sub-pixel.

20. The touch display panel according to claim 19, wherein the first sub-pixel, the second sub-pixel, and the third sub-pixel have different colors from each other.

* * * * *